United States Patent
Meck

(10) Patent No.: US 6,995,613 B2
(45) Date of Patent: Feb. 7, 2006

(54) POWER DISTRIBUTION AND BIASING IN RF SWITCH-MODE POWER AMPLIFIERS

(75) Inventor: Ronald A. Meck, Soquel, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 10/631,931

(22) Filed: Jul. 30, 2003

(65) Prior Publication Data

US 2005/0024147 A1 Feb. 3, 2005

(51) Int. Cl.
*H03F 3/04* (2006.01)

(52) U.S. Cl. ...................................... 330/297; 330/310
(58) Field of Classification Search ............... 330/297, 330/286, 296, 285, 53, 54, 150, 302, 310, 330/311

See application file for complete search history.

(56) References Cited

U.S. PATENT DOCUMENTS

| 6,320,468 B2 * | 11/2001 | Carroll et al. | ............... 330/286 |
| 6,501,335 B2 * | 12/2002 | Kakuta et al. | ............... 330/302 |
| 6,737,923 B2 * | 5/2004 | Yamamoto et al. | ......... 330/302 |

* cited by examiner

*Primary Examiner*—Henry Choe

(57) ABSTRACT

Methods of and apparatus for distributing power and biasing RF PAs. A power distribution network includes a pre-final amplifier stage power distribution network and a final amplifier stage power distribution network. The pre-final amplifier stage power distribution network includes one or more pre-final amplifier stage power distribution branches, which may be configured to distribute power from one or more pre-final amplifier power supplies to one or more pre-final amplifier stages. Each pre-final amplifier stage power distribution branch comprises a π C-R-C network coupled to an inductive load. A final amplifier stage power distribution network is configured to distribute power from a final amplifier stage power supply to a final stage of the amplifier circuit.

25 Claims, 6 Drawing Sheets

US 6,995,613 B2

POWER DISTRIBUTION AND BIASING IN RF SWITCH-MODE POWER AMPLIFIERS

FIELD OF THE INVENTION

The present invention relates generally to power amplifiers. More specifically, the present invention relates to power distribution and biasing in radio frequency switch-mode power amplifiers.

BACKGROUND OF THE INVENTION

Radio frequency (RF) power amplifiers (PAs) are used extensively in the wireless communications industry. An example of an RF PA that is suitable for use in, for example, a transmitter of a cellular telephone or wireless personal digital assistant (PDA), is shown in FIG. 1. RF PA 10 includes an amplifier circuit 12 having multiple amplifier stages. Multiple amplifier stages are used to achieve an overall power gain that may not be realizable using only a single stage at the RF frequencies of interest. In this manner, power amplifier circuit 12 provides successively increasing signal powers. In RF PA 10 in FIG. 1, amplifier circuit 12 is shown to contain three amplifier stages—a first stage 14, an intermediate stage 16, and a final stage 18. Typically, coupling capacitors 20 are connected to the inputs of each stage 14, 16 and 18. Each coupling capacitor 20 couples an RF input signal to the input of the associated amplifier stage and blocks DC components that may be present with the RF input signals.

RF PA 10 also includes a power distribution network 26, which distributes power to amplifier circuit 12. Typically, an operating supply $V_{OP}$ is distributed by power distribution network 26 to provide power to first 14 and intermediate 16 stages, and a separate power amplifying power supply $V_{PA}$ is distributed by power distribution network 26 to provide power to final stage 18. Final stage 18 is often powered separately from first 14 and intermediate 16 stages, since it typically has a power requirement that is substantially greater than power demands of previous stages. $V_{OP}$ is distributed to first 14 and intermediate 16 stages through inductors 28, and $V_{PA}$ is distributed to final stage 18 through inductor 29. Inductors 28 and 29 present high impedance paths to RF signals and low impedance paths to DC power supplied by $V_{OP}$ and $V_{PA}$.

As shown in FIG. 1, one or more RF bypass capacitors 30 are connected to operating supply $V_{OP}$, and an RF bypass capacitor 31 is connected to power amplifying power supply $V_{PA}$. Inclusion of the bypass capacitors 30 and 31 ensures that the AC impedances between $V_{OP}$ and ground, and $V_{PA}$ and ground, are nearly zero. These AC grounds are essential at the intended operating frequencies of the RF PA 10, since the entire signal voltage must appear across the inductors 28. At operating frequencies typical of RF amplifiers used in cellular systems, the values of these bypass capacitors are typically between 10 and 30 pF.

At frequencies lower than the intended amplifier operating frequency, the impedances of bypass capacitors 30 and 31 increase and bypass capacitors 30 and 31 become less effective at damping low frequency oscillations and providing AC grounds between $V_{OP}$ and $V_{PA}$. Also at lower frequencies, the gains of one or more of the amplifier stages 14, 16 and 18 also typically increase. An increased gain at lower frequencies is undesirable, since it may lead to low frequency oscillations and amplifier instability. Accordingly, to prevent low frequency oscillations and amplifier instability, additional bypass capacitors 34 and 36 are usually connected between operating supply $V_{OP}$ and ground, and between amplifying power supply $V_{PA}$ and ground. Compared to bypass capacitors 30 and 31, low frequency bypass capacitors 34 and 36 are quite large, and typically have capacitances in the range of 10,000 pF to 10 µF, or greater.

RF PA 10 further includes a biasing network 38 having one or more active bias circuits 39. Active bias circuits 39 set operating conditions for the active devices in each of stages 14, 16 and 18 of amplifier circuit 12. While setting the threshold conditions, active bias circuits 39 compensate for variations and/or instabilities in gain of the active devices due to shifts in operating conditions caused by various effects, such as variations in temperature among devices and physical differences among devices due to manufacturing differences.

In a conventional quadrature (IQ) modulator, a fully amplitude and phase modulated signal is applied to the RF input 22 of RF PA 10, and amplifier circuit 12 is biased by active bias network 38 for linear operation. A major problem with the conventional RF PA 10 design in FIG. 1, however, is that it does not function properly for polar modulation. Polar modulation is a modulation technique that splits an RF signal into two separate signal paths, one path that transmits an amplitude modulated signal and the other that transmits a phase modulated signal. Unlike IQ modulation, with polar modulation only a constant magnitude, phase modulated signal is applied to RF input 22 of RF PA 10. The phase modulated signal is used to control an on-channel voltage controlled oscillator (VCO), which provides a drive signal for driving the gate of a FET (or base, if a BJT) in first stage 14 of amplifier circuit 12. The amplitude modulated signal is used to modulate the drain (or collector, if a BJT) supply voltages $V_{PA}$ and/or $V_{OP}$. Although phase and amplitude information are independently processed, they are digitally synchronized so that the attributes of the unamplified input signal may be recovered. Further details of polar modulation can be found in U.S. Pat. No. 6,366,177 to McCune et al. and M. Heimbach, *Digital Multimode Technology Redefines the Nature of RF Transmission*, Applied Microwave & Wireless, August 2001.

As alluded to in the previous paragraph, envelope variation of one or both of the supply voltages $V_{PA}$ and $V_{OP}$ in a polar modulation approach is achieved by varying the amplitude of the supply voltage in a respective stage, synchronous to the already applied phase modulation. Depending on the RF technology employed, the frequency of the drain modulation of supply voltages $V_{PA}$ and/or $V_{OP}$ can be quite high. For example, for EDGE (Enhanced Data GSM (Global System for Global Communications) technology, the rate is on the order of 1 MHz. For UMTS (Universal Mobile Telecommunications System), rate rises to the order of 10 MHz. Accordingly, for polar modulation to be realizable, power distribution network 26 of RF PA 10 must be capable of tracking rapid variations in $V_{OP}$ and/or $V_{PA}$. Unfortunately, particularly for EDGE and UMTS technologies, power distribution network 26 is incapable of tracking such rapid variations. A primary reason for this is attributable to low frequency bypass capacitors 34 and 36, which inhibit the ability to rapidly change the supply voltages $V_{OP}$ and/or $V_{PA}$ due to their large capacitances.

Another problem associated with the conventional RF PA 10 design shown in FIG. 1 involves the propagation, i.e., undesired "feedback" of RF signals from an input of one stage, 14, 16 or 18, through the biasing network 38, to an input of another stage. This undesired coupling can result in distortion of the RF signal provided at the RF output 24 of RF PA 10 and instability in the gain of amplifier circuit 12.

The inability to track and provide rapid variations in supply voltage to amplifier circuit 12, and the instability problems attributable to RF coupling on the biasing network 38, render the RF PA design 10 in FIG. 1 not practicable for polar modulation systems. Accordingly, there is a need for an improved RF PA that is capable of supporting polar modulation.

SUMMARY OF THE INVENTION

Methods and apparatus for distributing power and biasing RF PAs are disclosed. According to an aspect of the invention, a power distribution network includes a pre-final amplifier stage power distribution network and a final amplifier stage power distribution network. The pre-final amplifier stage power distribution network includes one or more pre-final amplifier stage power distribution branches, which may be configured to distribute power from one or more pre-final amplifier stage power supplies to one or more pre-final amplifier stages. Each pre-final amplifier stage power distribution branch comprises a π C-R-C network coupled to an inductive load. A final amplifier stage power distribution network is configured to distribute power from a final amplifier stage power supply to a final stage of the amplifier circuit. Other alternative embodiments include, but are not necessarily limited to, power distribution networks that are configured to distribute power from a single power supply to all stages of an amplifier circuit, and a power distribution network configured to distribute power from multiple, individual power supplies to associated individual amplifier stage power distribution branches.

According to another aspect of the invention, a biasing network having one or more bias circuits is disclosed. Each bias circuit of the biasing network is configured to provide a bias signal to a corresponding bias input of an amplifier stage of the aforementioned amplifier circuit. Each bias circuit may be coupled to an RC filter to removes RF signals from the bias signals and to prevent RF signals from propagating from one active bias stage to another in the biasing network.

Further aspects of the invention are described and claimed below, and a further understanding of the nature and advantages of the inventions may be realized by reference to the remaining portions of the specification and the attached drawings.

DETAILED DESCRIPTION

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

Figure 2:
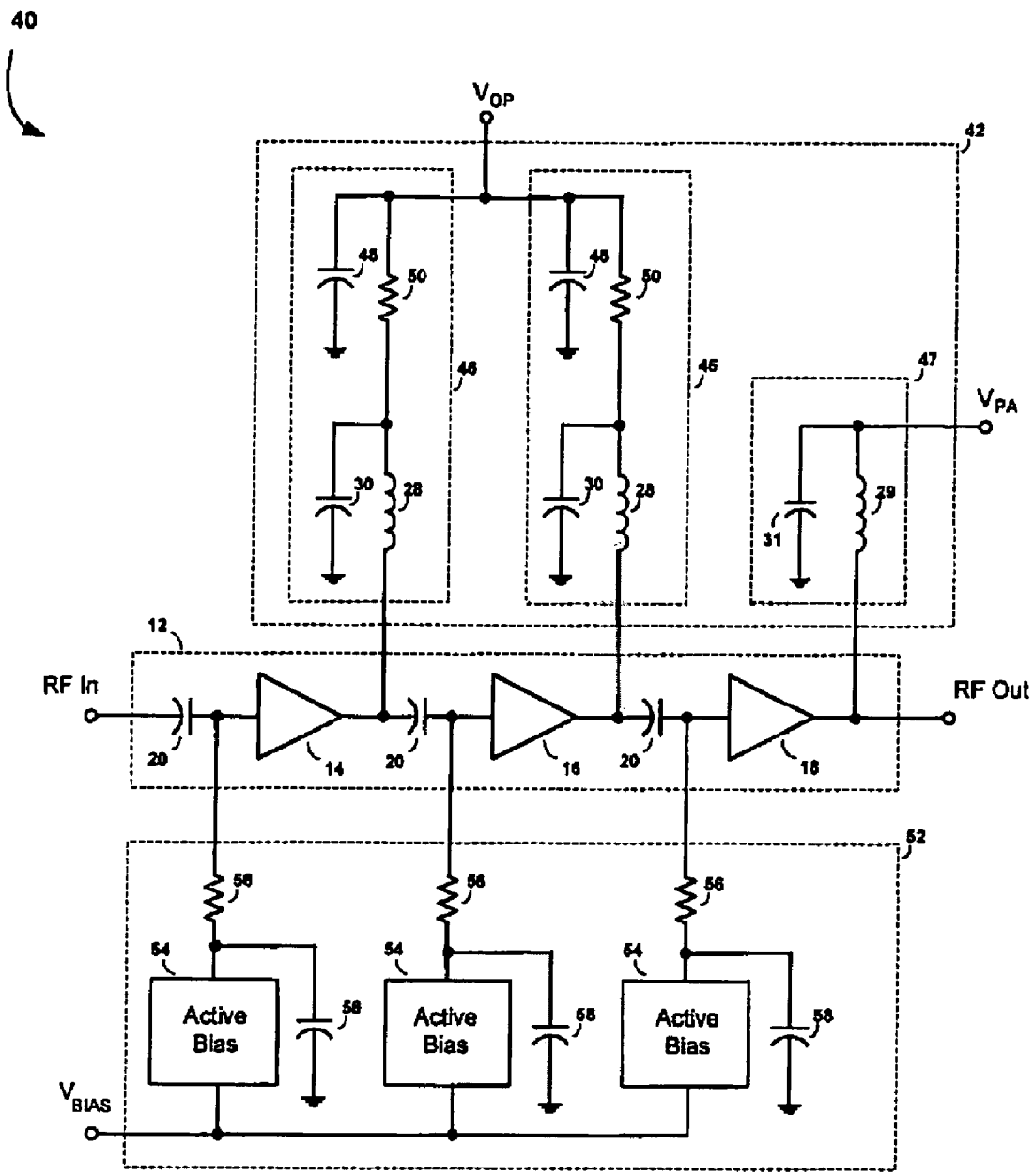
FIG. 2 is a simplified schematic diagram of an RF PA in which a final stage of the amplifier is powered by an amplifying power supply $V_{PA}$, and prior stages are powered by a separate operating supply $V_{OP}$, according to an embodiment of the present invention.

Referring to FIG. 2, there is shown a simplified schematic diagram of an RF PA 40, according to an embodiment of the present invention. RF PA 40 comprises an amplifier circuit 12, a power distribution network 42, and a biasing network 52. As shown, amplifier circuit 12 may be comprised of multiple stages, in this example a first stage 14, an intermediate stage 16 and a final stage 18. Coupling capacitors 20 are connected to the inputs of each stage 14, 16 and 18. Each coupling capacitor 20 couples an RF input signal to the input of the associated stage and blocks DC components that may be present with the RF signals.

RF PA 40 includes a power distribution network 42, which distributes power from an operating supply $V_{OP}$ to first 14 and intermediate 16 stages of amplifier circuit 12, and distributes power from a separate amplifying power supply $V_{PA}$ to final stage 18 of amplifier circuit 12. Final stage 18 is powered separately from first 14 and intermediate 16 stages, since it typically has a power requirement that is substantially greater than power demands of previous stages. Employing a separate supply $V_{PA}$ for final stage 18 allows RF PA 40 to amplify over a wider dynamic range than with use of only a single supply.

Coupled between operating supply $V_{OP}$ and first stage 14 of amplifier circuit 12 is a power distribution branch 46. Power distribution branch 46 is comprised of an inductor coupled to a π C-R-C network, which includes a first capacitor 48, a resistor 50 and a second capacitor 30. A similar or identical power distribution branch 46 is coupled between operating supply $V_{OP}$ and intermediate stage 16 of amplifier circuit 12. Power from amplifying power supply $V_{PA}$ is distributed to final stage 18 via a power distribution branch 47, which comprises an inductor 29 and a bypass capacitor 31. Bypass capacitor 31 provides an AC ground, similar to bypass capacitor 31 in the power distribution network 26 of the RF PA 10 in FIG. 1.

Figure 3A:
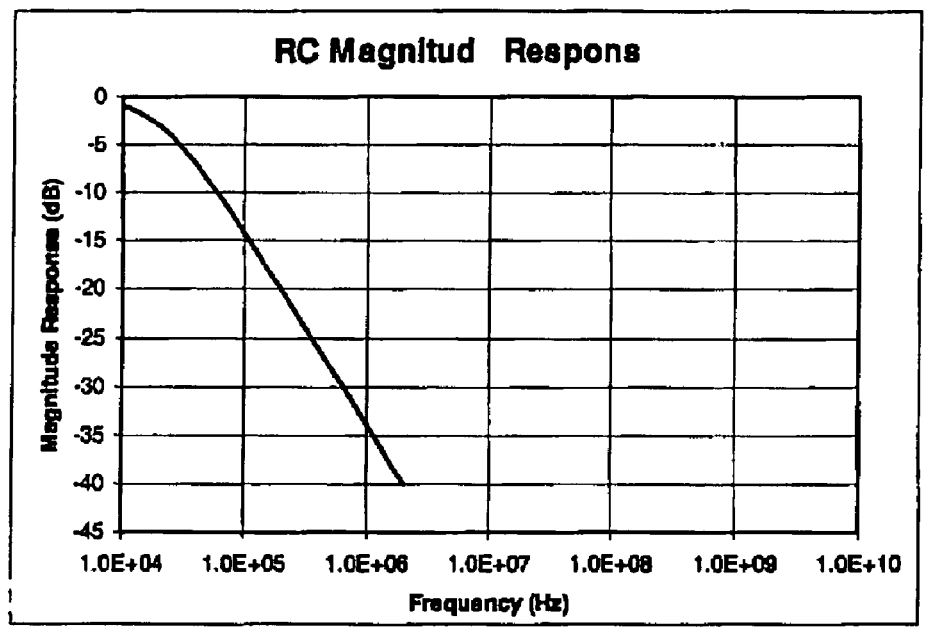
FIGS. 3A and 3B show RC magnitude and phase frequency response curves when using a large low frequency bypass capacitor as in the prior art RF PA in FIG. 1.
Figure 3B:
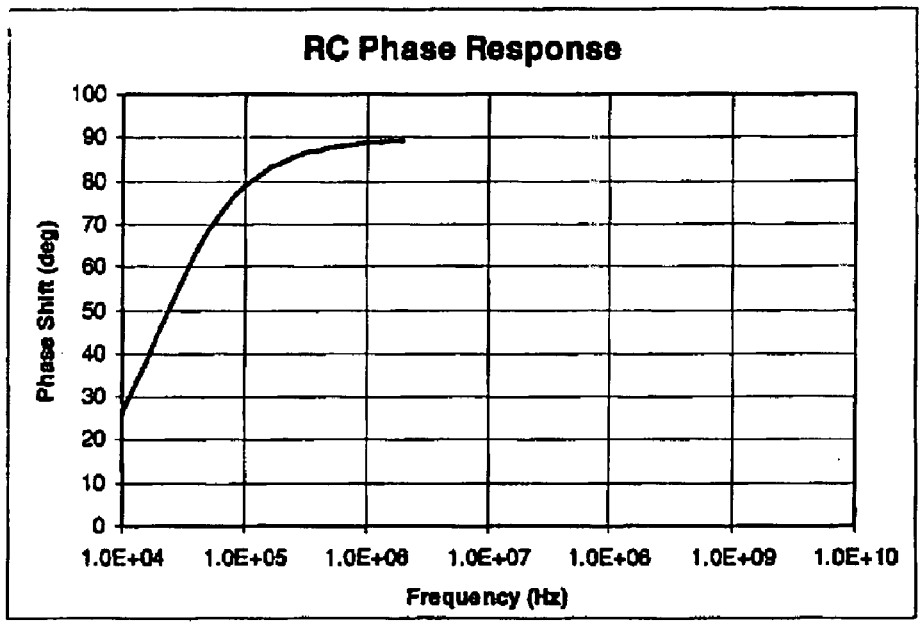

To prevent oscillations from occurring in a power distribution network of an RF PA, two fundamental conditions must be satisfied. First, the gain of the distribution network must be less than unity. Second, the total phase shift through frequency controlling elements must not be an integral multiple of 360 degrees. Power distribution networks of the prior art (e.g. power distribution network 26 in RF PA 10 in FIG. 1) rely on the large capacitances of capacitors 34, which as described above are in the range of 10,000 pF to 10 μF or above. FIG. 3A shows the RC magnitude frequency response for a prior art RC network using a single large bypass capacitor. The large bypass capacitor (relates to capacitors 34 and 36 in FIG. 1) has a capacitance value of 3.9 μF. At around 1–10 MHz (the frequency range where oscillations usually arise) the circuit gain is dropped by 35 dB or more. FIG. 3B shows the RC phase response for the prior art RC network over the same frequency range as in FIG. 3A. Over this same range of 1–10 MHz, the phase shift is a relatively constant 90 degrees, which has no affect on stability so long as the gain remains low. As explained above, whereas a power distribution network utilizing large bypass capacitors is somewhat effective at dampening low frequency oscillations, such power distribution networks are unattractive for use in amplifier designs that use, for example polar modulation, since the large low frequency bypass capacitors seriously inhibit drain modulation of power supply voltages.

Figure 4A:
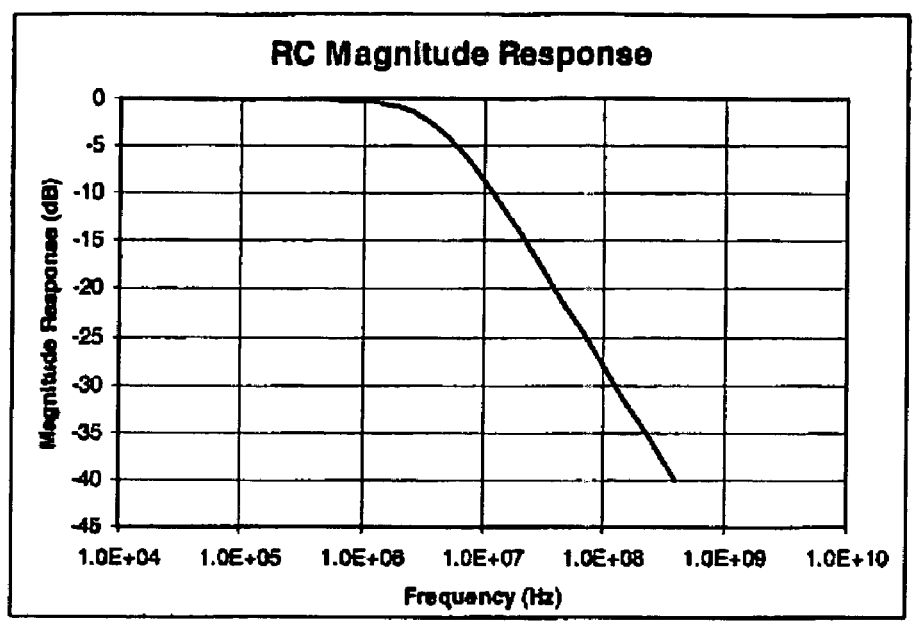
FIGS. 4A and 4B show RC magnitude and phase frequency response curves when using π C-R-C networks in the power distribution network of the RF PA in FIG. 2, according to an embodiment of the present invention.
Figure 4B:
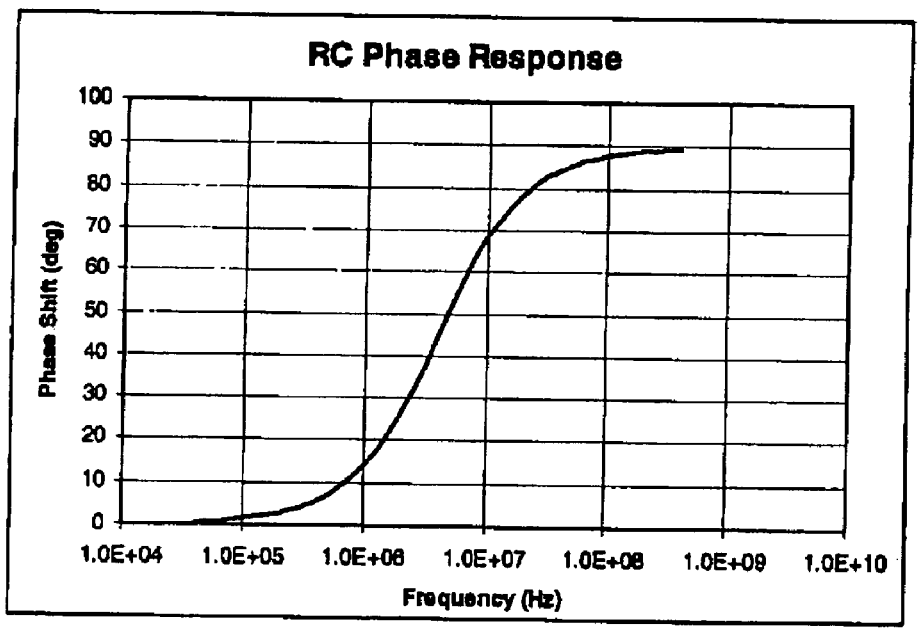

According to an embodiment of the present invention, phase shifting is exploited to assure that low frequency oscillations do not occur in the power distribution network 42 of RF PA 40. This is achieved by inserting small resistors 50 in power distribution branches 46 and simultaneously reducing the low frequency bypass capacitor value. FIGS. 4A and 4B show the RC magnitude and phase responses of the $\pi$ C-R-C networks of the power distribution network 40 of RF PA 40 in FIG. 2. For the exemplary frequency response curves, bypass capacitor 48 has a value of 0.0039 $\mu$F, which is 1000 times smaller than the low frequency bypass capacitor used in the prior art power distribution network. The resistance of the small resistor 50 is 10 $\Omega$. FIGS. 4A and 4B illustrate that, although the gain is higher across the frequency range of interest (1–10 MHz), the phase shifts in this range. Indeed, unlike the prior art phase response in FIG. 3B, the phase response using the $\pi$ C-R-C network according to the present invention results in a phase that shifts across essentially three orders of magnitude.

Figure 1:
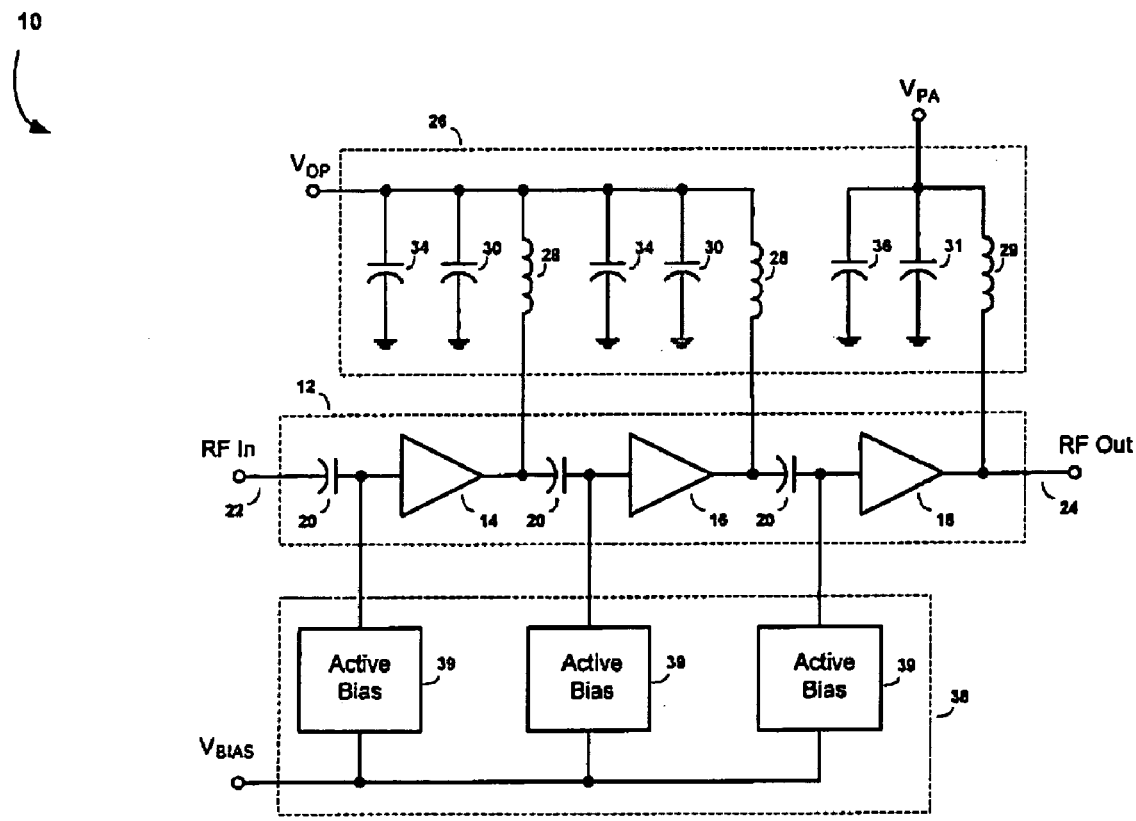
FIG. 1 is a simplified schematic diagram of a prior art RF PA.

Comparing FIGS. 4A and 4B to FIGS. 3A and 3B demonstrates that power distribution network 42 of the RF PA 40 in FIG. 2 dampens low frequency oscillations just as effectively or better than power distribution network 26 of the prior art RF PA 10 in FIG. 1. However, because there are no large capacitors, the power distribution network 42 of RF PA 40 in FIG. 2 does not inhibit envelope variation of power supplies $V_{OP}$ and $V_{PA}$. Accordingly, unlike the prior art PA, the RF PA 40 in FIG. 2 can be used in amplifiers using polar modulation and can be used in high-speed data communications technologies such as EDGE and UMTS.

Although not restricted to the following ranges, capacitances of capacitors 48 in the range of about 100 pF to 0.01 $\mu$F, and resistances of resistors 50 in the range of about 2 to 10 $\Omega$, were effective at providing an effective low frequency bypass. In one particular implementation, a capacitance of capacitors 48 was 100 pF and a resistance of resistors 50 was 2.2 $\Omega$. Whereas specific exemplary component values are given here, those skilled in the art will readily understand that the component values may be within or beyond these ranges and that actual values will depend on factors such as, for example, the operating frequency of RF PA 40, the frequencies of the undesired spurious signals to be suppressed, the components of the specific PA used, and the layout of surrounding circuitry. Capacitances of capacitors 30 and 31 will also vary depending on similar circumstances. Exemplary values for capacitors 30 and 31 are 27 pF for an operating frequency of 900 MHz and 4.7 pF for 2.4 GHz operation.

According to another embodiment of the present invention, RF PA 40 further comprises a biasing network 52 having one or more active bias circuits 54. Active bias circuits 54 set operating conditions for the active devices in each of stages 14, 16 and 18 of amplifier circuit 12. While setting the threshold conditions, active bias circuits 54 compensate for variations and/or instabilities in gain of the active devices due to shifts in operating conditions caused by various effects, such as variations in temperature among devices and physical differences among devices due to manufacturing differences. To reduce the effects of manufacturing and temperature variations on amplifier performance, each active bias circuit 54 may include a current mirror (e.g. a cascode type current mirror), which assists in maintaining constant, direct current flow through the active devices of active bias circuits 54 and provides for enhanced thermal stability of amplifier circuit 12.

According to an embodiment of the invention, RF filters, comprising resistors 56 and capacitors 58, may be coupled between the bias output of each active bias circuit 54 and the RF inputs of first 14, intermediate 16 and final stages 18. Resistance and capacitance values of resistors 56 and capacitors 58 are chosen so that they effectively remove unwanted RF signals from the bias voltages supplied by active bias circuits 54, and so that unwanted RF signals present on biasing network 52 are prevented from propagating among active bias circuits 54, i.e., from one active bias circuit 54 to another 54. Hence, distortion and undesirable variations in gain caused by RF signal propagation among stages is substantially reduced.

According to an exemplary embodiment, resistors 56 have resistances of between about 200 $\Omega$ and 100 k$\Omega$, and capacitors 58 have values on the order of about 0.01 to 0.1 $\mu$F. Whereas the component values for resistors 56 and capacitors 58 may be used to practice the exemplary embodiment disclosed, those skilled in the art will readily understand that the component values are only exemplary, and are provided only to illustrate the exemplary embodiment. Accordingly, different component values may also be determined and used, depending on the application in which RF PA 40 is to be used, in view of the frequencies of the desired RF signal band, the frequencies of the undesired, spurious signals to be suppressed, in relation to the input impedance of amplifier stages 14, 16 and 18, and/or in relation to the component values determined and used in power distribution network 42.

Figure 5:
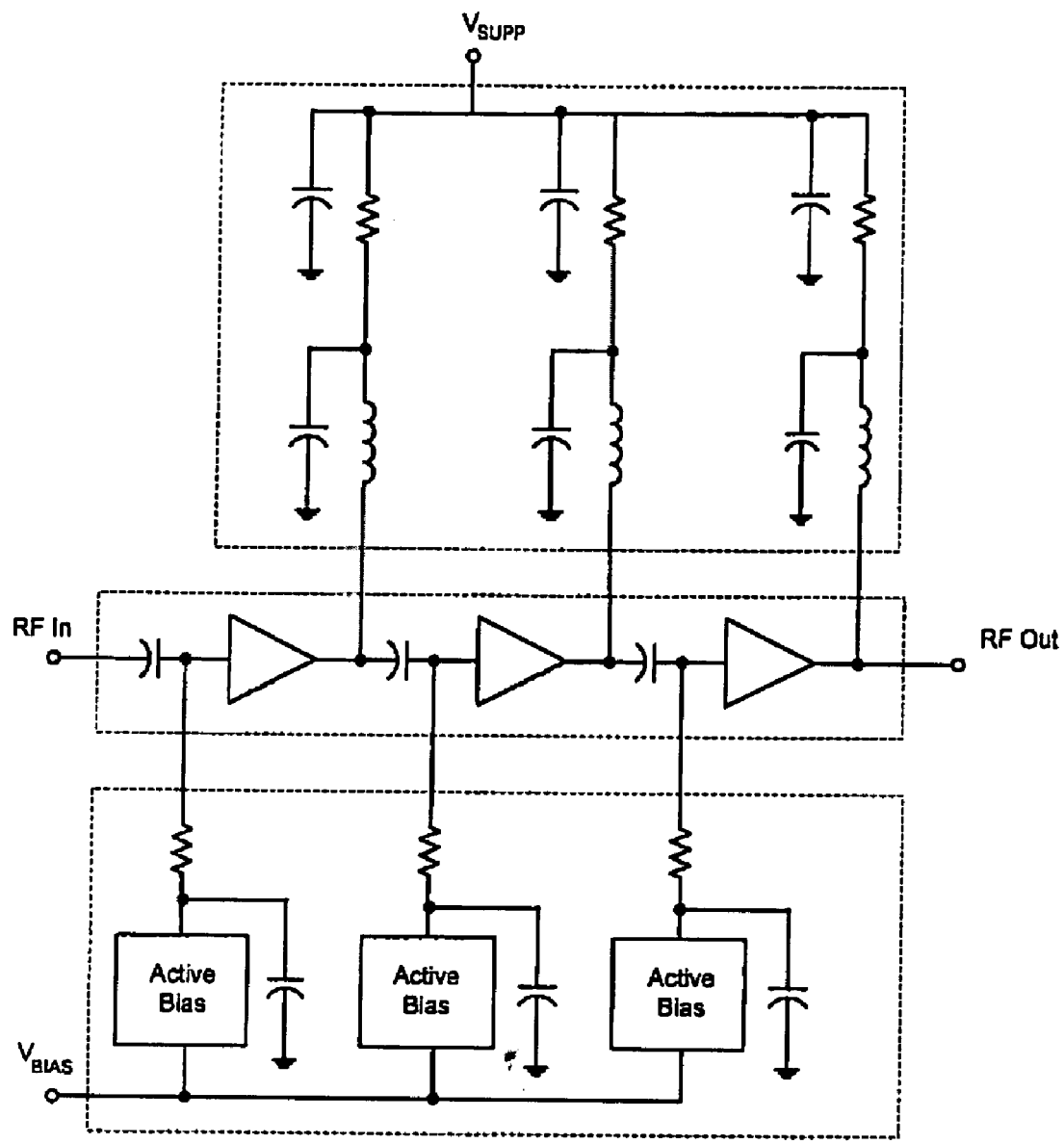
FIG. 5 is a simplified schematic diagram of an RF PA in which all stages of the amplifier are powered by single power supply $V_{SUPP}$, according to an embodiment of the present invention.
Figure 6:
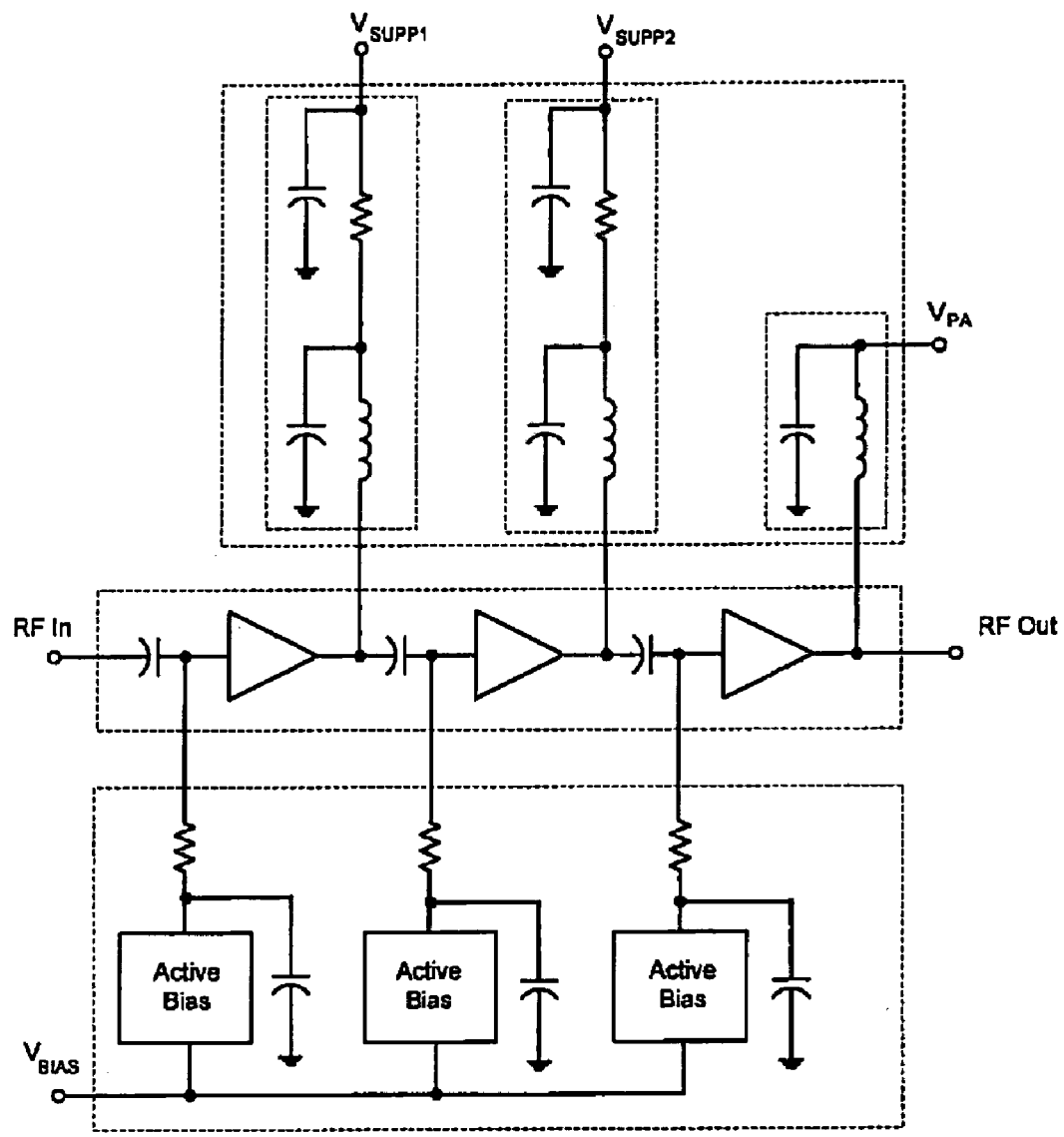
FIG. 6 is a simplified schematic diagram of an RF PA in which each stage of the amplifier is powered by separate power supplies $V_{SUPP1}$, $V_{SUPP2}$ and $V_{PA}$, according to an embodiment of the present invention.

Whereas the exemplary RF PA 40 in FIG. 2 has a three-stage amplifier circuit 12, those skilled in the art will readily understand that the RF PAs of the present invention may include a single stage or any number of stages. Moreover, whereas the final stage 18 of the RF PA 40 in FIG. 2 is shown to be powered by a separate power supply $V_{PA}$ and the preceding stages powered by a single operating supply $V_{OP}$, those skilled in the art will readily understand that the other supply configurations and number of supplies may be used, depending on the application. For example, in applications where wide dynamic range is not of great concern, the alternative embodiments of the present invention shown in FIGS. 5 and 6 may be employed. Finally, in operation, either or both of the power supplies $V_{OP}$ and $V_{PA}$ in FIG. 2 may be amplitude modulated to improve the efficiency of RF PA 40. Similarly, one or more of the power supplies $V_{SUPP}$, $V_{SUPP1}$, $V_{SUPP2}$ and $V_{SUPP3}$ may be modulated in the embodiments shown in FIGS. 5 and 6. Methods and apparatus that may be used to provide and perform power control and modulation of the power supplies of the various RF PA embodiments of the present invention are described in detail in co-pending and commonly assigned U.S. patent application Ser. No. 09/684,497, entitled "Power Control and Modulation of Switched-Mode Power Amplifiers With One or More Stages," and co-pending and commonly assigned U.S. patent application Ser. No. 09/834,024, entitled "Communications Signal Amplifiers Having Independent Power Control and Amplitude Modulation," both applications which are incorporated into this disclosure by reference.

Whereas the above is a complete description of the preferred embodiments of the invention, various alternatives, modifications, and equivalents may be used. Therefore, the above description should not be taken as limiting the scope of the invention as it is defined by the appended claims.

What is claimed is:

1. An RF amplifier, comprising:
   an amplifier circuit having a plurality of amplifier stages; and
   a corresponding plurality of power distribution branches configured to distribute one or more power supply voltages to said plurality of amplifier stages, wherein each of said power distribution branches includes its own unique π C-R-C network.

2. The RF amplifier of claim 1 wherein the amplifier circuit includes an input configured to receive a phase modulated RF signal.

3. The RF amplifier of claim 2 wherein the phase modulated RF signal has a constant magnitude.

4. The RF amplifier of claim 1 wherein one or more of said one or more power supply voltages has a variable magnitude.

5. The RF amplifier of claim 2 wherein one or more of said one or more power supply voltages has a variable magnitude.

6. The RF amplifier of claim 1, further comprising a biasing network having one or more bias circuits, each of said bias circuits having a power input and a bias signal output for providing a bias signal to a corresponding one of said one or more amplifier stages.

7. The RF amplifier of claim 6 wherein one or more of said bias circuits is coupled to an RC filter, said RC filter comprising:
   a resistor having a first end coupled to an RF input of one of said one or more amplifier stages and a second end; and
   a capacitor having a first end coupled to the second end of said resistor and a second end coupled to ground.

8. An RF power amplifier, comprising:
   an input amplifier stage having an input configured to receive a phase modulated RE signal;
   at least one intermediate amplifier stage having an input configured to receive an amplified RF signal from said input amplifier, or an amplified RF signal derived therefrom;
   a final amplifier stage having an input configured to receive a further amplified signal from an output of one of said at least one intermediate amplifier stage; and
   a power distribution network comprising a pre-final amplifier stage power distribution network and a final amplifier stage power distribution network, wherein said pre-final amplifier stage power distribution network includes a pre-final amplifier stage power distribution branch for each input amplifier stage and each intermediate amplifier stage, each pre-final amplifier stage power distribution branch comprising:
      a resistor having a first end configured to be coupled to a pre-final amplifier stage power supply and a second end,
      an inductor having a first end coupled to either said input amplifier stage or an intermediate amplifier stage and a second end coupled to the second end of said resistor,
      a first capacitor having a first end configured to be coupled only to the pre-final amplifier stage power supply and a second end coupled to ground, and
      a second capacitor having a first end coupled to the second end of said resistor and a second end coupled to ground.

9. The RF power amplifier of claim 8 wherein the final amplifier stage power distribution network comprises:
   an inductor having a first end coupled to said final amplifier stage and a second end configured to be coupled to a final amplifier stage power supply; and
   a capacitor having a first end coupled to the second end of said inductor and a second end coupled to ground.

10. The RF power amplifier of claim 9 wherein the input amplifier stage is configured to receive a phase modulated RF signal.

11. The RF power amplifier of claim 10 wherein the phase modulated RF signal has a constant magnitude.

12. The RF amplifier of claim 9 wherein said final amplifier stage power supply provides a variable magnitude supply voltage.

13. The RF amplifier of claim 8, further comprising a biasing network having active bias circuits associated with each of said input, at least one intermediate, and final amplifier stages, each bias circuit having an input configured to be coupled to a bias supply, an output for providing a bias signal to the associated amplifier stage.

14. The RF amplifier of claim 13 wherein each of said active bias circuits of said biasing network has an associated RC filter, said associated RC filter comprising:
   a resistor coupled between said output of the associated active bias circuit and the input of the associated amplifier stage; and
   a capacitor coupled between the output of the associated active bias circuit and ground.

15. A method of distributing power to an RF power amplifier, comprising:
   receiving a first power supply voltage at a first power supply node of said RF power amplifier;
   distributing said first power supply voltage to a first stage of a power amplifier circuit of said RF power amplifier;
   receiving a second power supply voltage at a second power supply node of said RF power amplifier; and
   distributing said second power supply voltage to a second stage of said power amplifier circuit,
   wherein distributing said first power supply voltage includes passing said first supply voltage through a π C-R-C network.

16. The method of claim 15, further comprising preventing RF signals from propagating between active bias circuits that provide bias signals to said first and second amplifier stages.

17. An RF power amplifier, comprising:
   means for distributing a first power supply voltage to a first stage of a power amplifier circuit of said RF power amplifier; and
   means for distributing a second power supply voltage to a second stage of said power amplifier circuit,
   wherein said means for distributing said first power supply voltage includes means for passing said first supply voltage through a π C-R-C network.

18. The RF power amplifier of claim 17, further comprising means for preventing RF signals from propagating between active bias circuits that provide bias signals to said first and second amplifier stages.

19. An RF power amplifier, comprising:
   an input amplifier stage having an input configured to receive an RF input signal;

an output amplifier stage operable to provide an amplified RF output signal;

one or more intermediate amplifier stages coupled between said input and output amplifier stages; and a power distribution network configured to receive a power supply voltage and distribute it through a first power distribution branch to a power input of said input amplifier stage, said first power distribution branch comprising:

a resistor having a first end configured to receive said power supply voltage, an inductor having a first end coupled to said input amplifier stage and a second end coupled to a second end of said resistor, a first capacitor having a first end configured to receive said power supply voltage and a second end coupled to ground, and a second capacitor having a first end coupled to the second end of said resistor and a second end coupled to ground.

20. The RF power amplifier of claim 19 wherein the power distribution network further includes a second power distribution branch comprising:

an inductor having a first end coupled to a power input of said output amplifier stage and a second end configured to receive a second power supply voltage; and a capacitor having a first end coupled to the second end of said inductor and a second end coupled to ground.

21. The RF power amplifier of claim 19, further comprising a biasing network operable to provide bias voltages to inputs of the input, one or more intermediate, and output amplifier stages, said biasing network comprising:

an input amplifier stage active bias circuit having an input for receiving a bias supply voltage and an output for providing an input stage bias voltage to the input of said input amplifier stage;

one or more intermediate amplifier stages having inputs for receiving the bias supply voltage and outputs for providing intermediate amplifier stage bias voltages to corresponding inputs of said one or more intermediate amplifier stages; and an output amplifier stage active bias circuit having an input for receiving a bias supply voltage and an output for providing an output stage bias voltage to the input of said output amplifier stage.

22. The RF power amplifier of claim 21 wherein each of the active bias circuits have associated RC filters, each RC filter comprising:

a resistor having a first end coupled to the output of the associated active circuit and a second end coupled to the input of the associated amplifier stage; and a capacitor having a first end coupled to the first end of the resistor and a second end coupled to ground.

23. A power distribution network for an RF power amplifier, comprising:

a first power distribution branch for distributing a first power supply voltage to an input stage of a multistage amplifier circuit of an RF power amplifier; and a second power distribution branch for distributing a second power supply voltage to an output stage of said amplifier circuit, wherein said first power distribution branch comprises:

a resistor having a first end configured to receive said first power supply voltage, an inductor having a first end coupled to said first amplifier stage and a second end coupled to a second end of said resistor, a first capacitor having a first end configured to receive said first power supply voltage and a second end coupled to ground, and a second capacitor having a first end coupled to the second end of said resistor and a second end coupled to ground.

24. The power distribution network of claim 23, further comprising an intermediate stage power distribution branch for distributing the first power supply voltage to an intermediate amplifier stage of said amplifier circuit, said intermediate amplifier stage coupled between the input and output stages of said multistage amplifier circuit.

25. The power distribution network of claim 23, further comprising an intermediate stage power distribution branch for distributing a third power supply voltage to an intermediate amplifier stage of said amplifier circuit, said intermediate amplifier stage coupled between the input and output stages of said multistage amplifier circuit.

* * * * *